United States Patent [19]

Abrokwah

[11] Patent Number: 4,550,031
[45] Date of Patent: Oct. 29, 1985

[54] CONTROL OF SI DOPING IN GAAS, (AL,GA)AS AND OTHER COMPOUND SEMICONDUCTORS DURING MBE GROWTH

[75] Inventor: Jonathan K. Abrokwah, Rosemount, Minn.

[73] Assignee: Honeywell Inc., Minneapolis, Minn.

[21] Appl. No.: 674,794

[22] Filed: Nov. 26, 1984

[51] Int. Cl.[4] ............................................. B05D 3/06
[52] U.S. Cl. ...................................... 427/10; 427/38; 427/85; 427/87; 427/93; 427/250; 427/255.2; 427/294
[58] Field of Search ...................... 427/38, 10, 85, 87, 427/93, 250, 255.2, 294

Primary Examiner—Bernard D. Pianalto
Attorney, Agent, or Firm—Omund R. Dahle

[57] ABSTRACT

A method of modulation doping GaAs, (Al,Ga)As and related compounds with silicon ions during molecular beam epitaxy (MBE) growth.

12 Claims, 2 Drawing Figures

CONTROL OF SI DOPING IN GAAS, (AL,GA)AS AND OTHER COMPOUND SEMICONDUCTORS DURING MBE GROWTH

BACKGROUND AND SUMMARY OF THE INVENTION

The present invention is directed to the field of the silicon doping of GaAs and (Al,Ga)As and other 3-5, 4-6 and 2-6 compound semiconductors during molecular beam epitaxy (MBE) growth, and particularly to the use of ionized silicon doping.

In the manufacture of modulation-doped field effect transistors (MODFETs) using molecular beam epitaxy technology with GaAs and (Al,Ga)As heterostructures, some of the items to be controlled are the MODFET threshold voltage, reproducibility and uniformity over large substrate areas, and minimizing of MBE surface defects. Uniformity of thickness and doping is very important since the FET threshold voltage depends on the $Nd^2$ product, where N is the doping and d is the thickness of the doped (Al,Ga)As layer.

The conventional past approach to dope (Al,Ga)As and GaAs n-type during molecular beam epitaxy (MBE) growth is by a neutral thermal molecular beam of silicon from an effusion cell. A limitation of this approach is that the flux of neutral silicon is very low ($<10^{11}$ molecules/cm$^2$-sec) and is not easily measurable by an ion gauge. Thus the reproducibility of doping with neutral silicon is difficult.

This invention replaces the neutral Si beam with a low energy silicon ion (Si+) beam. The flux of Si ions can be measured with an ion probe at the substrate location and thus the reproducibility of the doping is improved as the silicon flux is directly measured.

DESCRIPTION

Figure 1:
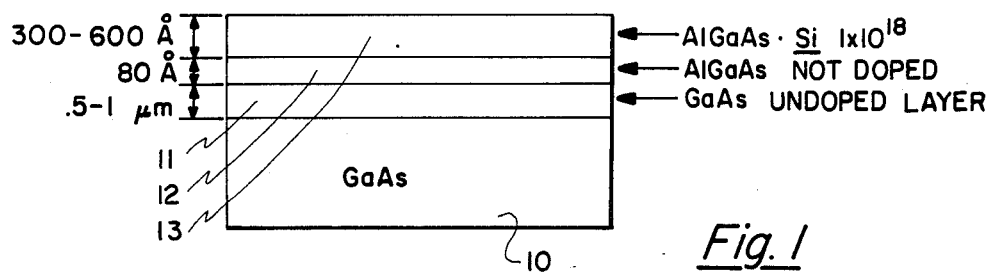
FIG. 1 is a sketch of a GaAs (Al,Ga)As heterostructure semiconductor device doped according to the invention with Si ions.

In FIG. 1 there is shown an exemplary heterostructure GaAs, $Al_xGa_{1-x}As$ (where $x \leq 0$), semiconductor device for use in high speed integrated circuits, at least a part of which is to be modulation doped with silicon ions. The figure shows a semi-insulating GaAs substrate 10 having epitaxially grown thereon by MBE an undoped layer of GaAs 11, an undoped layer of (Al,Ga)As 12 and a silicon doped layer of (Al,Ga)As 13. Representative thickness of the epitaxial layers are shown in the figure with the GaAs undoped layer about 0.5-1 μm, the (Al,Ga)As undoped layer about 80 Å and the (Al,Ga)As silicon doped layer about 300-600 Å. The structures were grown by MBE at a substrate temperature near 600° C. as has been generally described in an article coauthored by the present inventor and N. C. Cirillo, Jr., M. J. Helix, and M. Longerbone, entitled "Modulation-doped FET Threshold Voltage Uniformity of a High Throughput 3 inch MBE System", J.Vac.Sci.-Technol. B2(2), April-June 1984, P252-255. In that article, however, neutral silicon was used as the n-type dopant.

Figure 2:
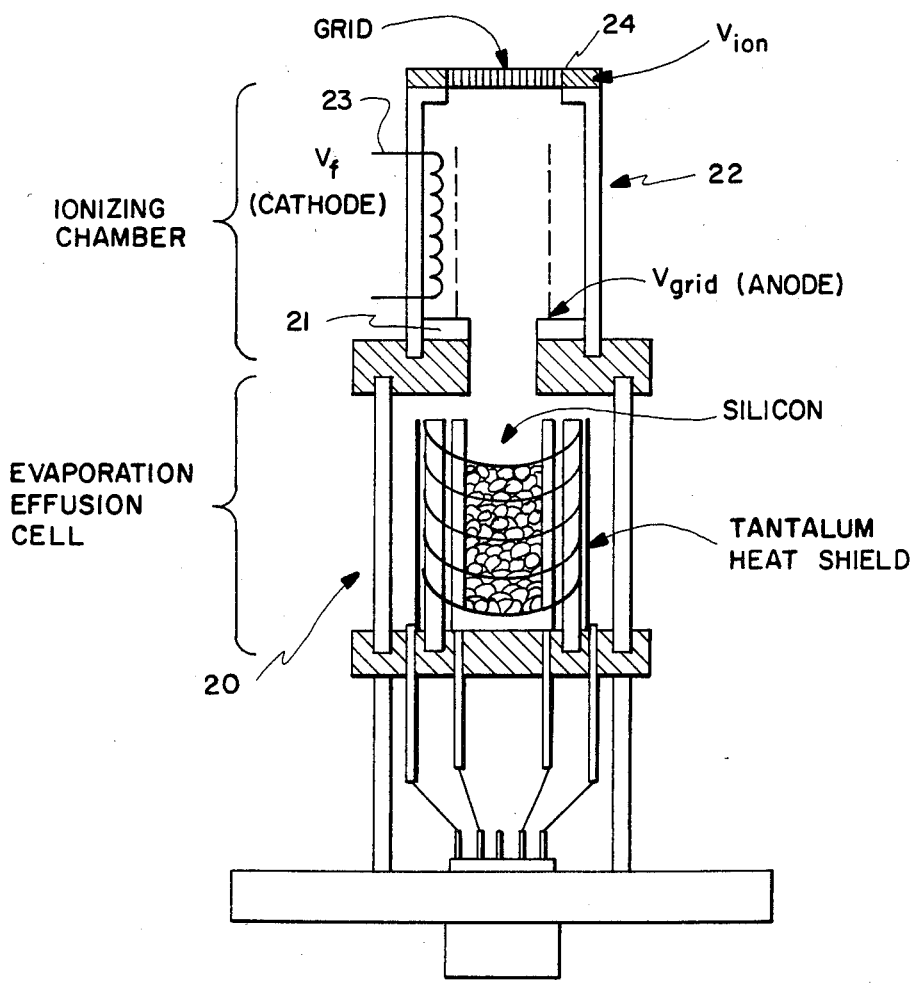
FIG. 2 is a diagram of a silicon ion beam source for use in doping during MBE growth.

The silicon ion beam source for doping during MBE growth used in the present invention is shown in FIG. 2. A high purity thermal molecular beam of silicon is produced by the first stage 20 of the Si ion source. The Si neutrals are passed through the grid 21 of the second stage 22 of a discharge chamber where they are bombarded and ionized by energetic electrons produced from a hot cathode tantalum filament 23. The electron energy is typically (50-200 eV). Collision is enhanced using an equipotential grid design which ensures spiral motions of the electrons before striking at the grid. The Si ions are extracted through a perforated tantalum grid or collector 24 of negative potential (50-200 eV) with respect to the anode grid. An electric field can be imposed on the silicon beam to steer it so that only ionized species arrive at the substrate. The Si ion flux can be measured by the electron current flowing from the substrate block 10 to ground. It can also be measured using a node ionization gauge.

The Si ion beam source described above is mounted on the MBE source flange and can be shuttered on and off similar to the other sources. The flux of ionized silicon admitted onto the substrate surface depends on the vapor pressure and hence temperature of the silicon neutral evaporation cell and the electron emission current from the hot cathode. The Si evaporation source can be replaced by a gaseous source such as $SiH_4$. Such source will not require any heating. The silane is introduced through an external leak valve attached to such silicon cell. The silane is passed through the discharge chamber and ionized in the same manner as described above. The ionized silicon source reduces concentration of deep levels due to arsenic vacancy and silicon donor complexes by virtue of the fact that arsenic vacancies are donors and hence when ionized are positively charged. The positively charged silicon ions repel arsenic vacancy due to a common-ion effect. Instead the silicon ions attract Ga vacancies and substitute efficiently at the Ga lattice site. The concentration of the dominant deep centers in (Al,Ga)As which are the DX or $V_{AS}$.Si complex will therefore be reduced.

In the above description there has been described the modulation doping of $Al_xGa_{1-x}As$ (where $x \leq 0$) with ionized silicon during molecular beam epitaxial growth. The ionized silicon doping is not limited to $Al_xGa_{1-x}As$ compound semiconductors but is also applicable to other selected 3-5, 2-6 and 4-6 compound semiconductors during MBE growth.

The embodiments of the invention in which an exclusive property or right is claimed are defined as follows:

1. The method of measuring silicon dopant in the modulation doping of GaAs and (Al,Ga)As layers with silicon ions during molecular beam epitaxial growth, the method comprising the steps of:

forming in vacuum a molecular beam of semiconductor materials Ga, As and optionally Al;
   epitaxially depositing said materials on a GaAs substrate from said molecular beam to form an epitaxial layer;
   forming in said vacuum a low energy silicon ion (Si+) beam for doping;
   measuring the flux of said silicon ion beam to control the reproducibility of the doping; and,
   directing said silicon ion beam to said epitaxial layer while said layer is being deposited.

2. The method according to claim 1, in which said step of forming a low energy silicon ion beam further comprises:

forming in said vacuum a high purity source of neutral silicon atoms;

passing said neutral silicon atoms through a second region where they are bombarded and ionized by energetic electrons produced from a hot cathode filament.

3. The method according to claim 2 in which said source of neutral silicon atoms is from flowing neutral silane gas.

4. The method according to claim 2 in which said source of neutral silicon atoms is a high purity thermal neutral silicon beam.

5. The method of measuring silicon dopant in the modulation doping of compound semiconductors with silicon ions during molecular beam epitaxial growth, the method comprising the steps of:

forming in vacuum from effusion cells molecular beams of semiconductor materials constituting the compound semiconductor;

epitaxially depositing said materials on a compatible substrate from said molecular beams to form an epitaxial layer;

forming in said vacuum a low energy silicon ion (Si+) beam for doping;

measuring the flux of said silicon ion beam to control the reproducibility of the doping; and, directing said silicon ion beam to said epitaxial layer while said layer is being deposited.

6. The method according to claim 5, in which said step of forming a low energy silicon ion beam further comprises:

forming in said vacuum a high purity source of neutral silicon atoms;

passing said neutral silicon atoms through a second region where they are bombarded and ionized by energetic electrons produced from a hot cathode filament.

7. The method according to claim 6 in which said source of neutral silicon atoms is from flowing neutral silane gas.

8. The method according to claim 6 in which said source of neutral silicon atoms is a high purity thermal neutral silicon beam.

9. The method of measuring silicon dopant in the modulation doping of selected 3-5, 4-6 and 2-6 compound semiconductor layers with silicon ions during molecular beam epitaxial growth, the method comprising the steps of:

forming in vacuum from effusion cells molecular beams of semiconductor materials constituting the selected compound semiconductor;

epitaxially depositing said materials on a compatible substrate from said molecular beam to form an epitaxial layer;

forming in said vacuum a low energy silicon ion (Si+) beam for doping;

measuring the flux of said silicon ion beam to control the reproducibility of the doping; and, directing said silicon ion beam to said epitaxial layer while said layer is being deposited.

10. The method according to claim 5, in which said step of forming a low energy silicon ion beam further comprises:

forming in said vacuum a high purity source of neutral silicon atoms;

passing said neutral silicon atoms through a second region where they are bombarded and ionized by energetic electrons produced from a hot cathode filament.

11. The method according to claim 10 in which said source of neutral silicon atoms is from flowing neutral silane gas.

12. The method according to claim 10 in which said source of neutral silicon atoms is a high purity thermal neutral silicon beam.

* * * * *

UNITED STATES PATENT AND TRADEMARK OFFICE
CERTIFICATE OF CORRECTION

PATENT NO. : 4,550,031
DATED : October 29, 1985
INVENTOR(S) : Jonathan K. Abrokwah It is certified that error appears in the above-identified patent and that said Letters Patent is hereby corrected as shown below:

Column 1, line 46, cancel "(where $x \leq 0$)" and substitute --(where $x \geq 0$)--.

Column 2, line 41, cancel "(where $x \leq 0$)" and substitute --(where $x \geq 0$)--.

Signed and Sealed this

Twenty-eighth Day of January 1986

[SEAL]

Attest:

DONALD J. QUIGG

Attesting Officer

Commissioner of Patents and Trademarks